(12) United States Patent
Shibata

(10) Patent No.: US 6,921,923 B1
(45) Date of Patent: Jul. 26, 2005

(54) GROUP III NITRIDE COMPOUND SEMICONDUCTOR DEVICE

(75) Inventor: Naoki Shibata, Bisai (JP)

(73) Assignee: Toyoda Gosei Co., Ltd., Nishikasugai-gun (JP)

(*) Notice: Subject to any disclaimer, the term of this patent is extended or adjusted under 35 U.S.C. 154(b) by 0 days.

(21) Appl. No.: 09/493,819

(22) Filed: Jan. 28, 2000

(30) Foreign Application Priority Data

Mar. 12, 1999 (JP) .......................................... 11-065880

(51) Int. Cl.[7] ............................................. H10L 33/00
(52) U.S. Cl. ...................................... 257/94; 257/103
(58) Field of Search .............................................. 257/94

(56) References Cited

U.S. PATENT DOCUMENTS

| | | | | |
|---|---|---|---|---|
| 5,523,589 A | * | 6/1996 | Edmond et al. | 257/77 |
| 5,656,832 A | * | 8/1997 | Ohba et al. | 257/190 |
| 6,046,464 A | * | 4/2000 | Schetzina | 257/96 |
| 6,072,189 A | * | 6/2000 | Duggan | 257/14 |
| 6,258,617 B1 | * | 7/2001 | Nitta et al. | 438/46 |

* cited by examiner

*Primary Examiner*—Douglas Wille
(74) *Attorney, Agent, or Firm*—McGinn & Gibb, PLLC

(57) ABSTRACT

An InGaN layer is formed on an undercoat layer of the same composition as the InGaN layer. The composition of the undercoat layer may be changed continuously or stepwise.

5 Claims, 3 Drawing Sheets

GROUP III NITRIDE COMPOUND SEMICONDUCTOR DEVICE

BACKGROUND OF THE INVENTION

1. Field of Invention

The present invention relates to a group III nitride compound semiconductor device.

The present application is based on Japanese Patent Application No. Hei. 11-65880, which is incorporated herein by reference.

2. Description of the Related Art

It is known that group III nitride compound semiconductors can be utilized, for example, as blue light-emitting devices. As a method of producing a group III nitride compound semiconductor device, there has been heretofore proposed a method comprising the steps of: growing a buffer layer of AlN or GaN on a sapphire substrate; growing a layer of GaN or AlGaN (hereinafter referred to as undercoat layer) by several microns on the buffer layer; and growing a layer of InGaN (hereinafter referred to as InGaN layer) on the undercoat layer (see Japanese Patent No. 2751963).

In the aforementioned method, however, the composition of the InGaN layer was different from the composition of the undercoat layer (AlGaN or GaN). Hence, the former was heteroepitaxially grown on the latter. Moreover, when the two layers were to be formed by means of a metal organic chemical vapor deposition method (hereinafter abbreviated as MOCVD method), the temperature for the growth of the undercoat layer (AlGaN or GaN) was generally about 1000° C. whereas the temperature for the growth of the InGaN layer was from about 700° C. to about 900° C. Improvement in crystallinity of the InGaN layer formed on the undercoat layer was limited because of the problem in heteroepitaxial growth and difference between the growth temperatures as described above.

SUMMARY OF THE INVENTION

Therefore, the present invention has as its object the provision of a novel-structure of a group III nitride compound semiconductor device having an InGaN layer higher in crystallinity. By improvement in crystallinity of InGaN, improvement in emitted light intensity is attained when InGaN is utilized for a light-emitting device.

The present invention is designed to solve the aforementioned problem. According to a first aspect of this invention, the configuration is as follows. That is, According to the semiconductor device configured in the aforementioned manner, the second layer of $In_YGa_{1-Y}N$ ($0<Y<1$, $Y \neq X$) is constituted by the same composition as the first layer of $In_XGa_{1-X}N$ ($0<X<1$) which is the undercoat of the second layer. Hence, not only the second layer can be homoepitaxially grown on the first layer but also the two layers can be grown at substantially equal growth temperatures. As a result, the second layer high in crystallinity can be obtained.

Features and advantages of the invention will be evident from the following detailed description of the preferred embodiments described in conjunction with the attached drawings.

DETAILED DESCRIPTION OF THE PREFERRED EMBODIMENTS

Figure 1:
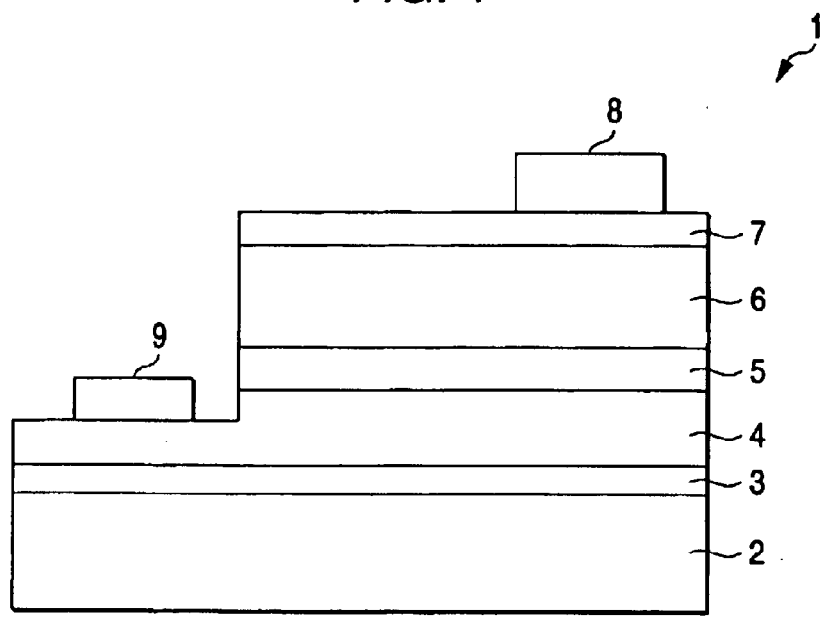
FIG. 1 is a sectional view showing a light-emitting diode 1 as an embodiment of-the present invention.

Respective constituent elements of the present invention will be described below.

A group III nitride compound semiconductor is generally represented by $Al_XGa_YIn_{1-X-Y}N$ ($0 \leq X \leq 1$, $0 \leq Y \leq 1$, $X+Y \leq 1$). A layer of such a GaN semiconductor is grown by the known MOCVD method. Alternatively, the layer can be grown by a known molecular beam epitaxy method (hereinafter abbreviated as MBE method), or the like.

The substrate used in the present invention is optional. A sapphire substrate is used preferably. Besides this, substrates of Si, SiC, etc. can be used.

When a sapphire substrate is used, $Al_XGa_{1-X}N$ ($0 \leq X \leq 1$) is used as a buffer layer. The buffer layer is used for facilitating the formation of the GaN semiconductor layer. The thickness of the buffer layer is not limited specially. Further, the buffer layer may be provided as a single layer or as a laminate consisting of a plurality of buffer layers.

Also when another substrate material is used, a buffer layer of a material adapted for the substrate material is used. When, for example, an Si (111) substrate is adopted, a buffer layer having a structure of Al/TiN/Ti viewed from the substrate side is used.

The first layer is formed of $In_XGa_{1-X}N$ ($0<X<1$). When, for example, the first layer is used as a clad layer in a light-emitting device, the first layer is doped with an acceptor or a donor in order to obtain a desired electric conduction type.

Assuming now that $Al_XGa_{1-X}N$ ($0 \leq X \leq 1$) is used as the buffer layer, the lattice constant of the buffer layer is smaller than the lattice constant of the first layer. Further, the difference between the lattice constants of the two layers decreases as the composition ratio of In in the first layer decreases. Therefore, the composition ratio of In in the first layer is preferably enlarged continuously or intermittently in the direction toward the second layer side from the buffer layer side. Consequently, not only the first layer in a face touching the buffer layer is lattice-matched with the buffer layer more sufficiently but also the composition of the first layer in a face touching the second layer is made substantially equal to the composition of the second layer. In this manner, the first layer lattice-matched with the buffer layer in a first layer face touching the buffer layer and lattice-matched with the second layer in a first layer face touching the second layer is obtained. As a result, the crystallinity of the first layer is improved, so that the quality of the second layer formed on the high-crystallinity first layer becomes higher.

Assuming now that the MOCVD method is taken as an example, the composition of the first layer can be changed continuously or intermittently only if the composition ratio of raw-material gases is changed continuously or intermittently in accordance with the growth of the first layer.

The second layer is formed of $In_YGa_{1-Y}N$ ($0<Y<1$, $Y \neq X$). When, for example, this layer is used in a light-emitting device, this layer serves as a light-emitting layer. A known double hetero-structure, a known superlattice structure, or the like, is used as the light-emitting device. Moreover, the second layer can be applied also to an electronic device represented by an FET structure.

Assuming now that a light-emitting device is taken as an example, a clad layer is formed on the second layer by a known method. When an electrically insulating substrate such as a sapphire substrate, or the like, is used, an n-type electrode and a p-type electrode are formed after required etching steps.

Configuration according to a second aspect of the present invention will be described below. According to the aspect of the present invention, the first layer according to the first aspect of the present invention is replaced by that of $Al_aGa_bIn_{1-a-b}N$ ($0<a<1$, $0<b<1$, $a+b<1$). This is because addition of Al to the composition makes it possible to widen the band gap of the first layer compared with that according to the first aspect of the present invention. In this manner, when, for example, the second layer is used as a light-emitting layer in a light-emitting device, the role of a more excellent clad layer can be given to the first layer.

Although the composition ratio of Al and In in the first layer is optional, the composition ratio of Al and In is preferably selected so that the lattice constant of the first layer is made substantially equal to the lattice constant of the second layer in order to perform lattice matching between the first layer and the second layer formed on the first layer.

Similarly to the case according to the first aspect of the present invention, the composition ratio of Al and In in the first layer may be changed continuously or intermittently in the direction toward the second layer side from the buffer layer side. In this manner, the first layer more effectively lattice-matched with the buffer layer in a first layer face touching the buffer layer and lattice-matched with the second layer in a first layer face touching the second layer is obtained. As a result, the crystallinity of the first layer is improved, so that the quality of the second layer formed on the high-crystallinity first layer becomes higher.

When the composition ratio of Al and In in the first layer is to be changed, the composition ratio of Al and In is preferably changed so that the band gap of the first layer in a face touching the second layer becomes wider than the band gap of the second layer.

The aforementioned first layer is formed by the same method as that according to the first aspect of the present invention.

Embodiments according to the first aspect of the present invention will be described below with reference to the drawings.

First Embodiment

FIG. 1 shows a light-emitting diode 1 as an embodiment of the present invention. Specifications of respective semiconductor layers are as follows.

| Layer | Component | Dopant | (Thickness) |
|---|---|---|---|
| p-type clad layer 6 | p-GaN | Mg | (0.3 μm) |
| Second layer: light-emitting layer 5 | $In_{0.15}Ga_{0.85}N$ | | (3.5 nm) |
| First layer: n-type clad layer 4 | $n\text{-}In_{0.02}Ga_{0.98}N$ | Si | (4 μm) |
| Buffer layer 3 | AlN | | (50 nm) |
| Substrate 2 | sapphire | | (300 μm) |

The buffer layer 3 is laminated on the substrate 1 by the MOCVD method.

The n-type clad layer 4, which is the first layer, may be of a double-layered structure with an $n^-$ layer of a low electron density on the light-emitting layer 5 side and an $n^+$ layer of a high electron density on the buffer layer 3 side.

The light-emitting layer 5, which is the second layer, is not limited to this embodiment but a multiple quantum well structure, or the like, can be used as this layer.

An $Al_XGa_YIn_{1-X-Y}N$ ($0 \leq X \leq 1$, $0 \leq Y \leq 1$, $X+Y \leq 1$) layer, which has a wide band gap and which is doped with an acceptor such as magnesium, or the like, may be interposed between the light-emitting layer 5 and the p-type clad layer 6. This technique is employed for preventing electrons implanted into the light-emitting layer 5 from being diffused into the p-type clad layer 6.

The p-type clad layer 6 may be of a double-layered structure with a $p^-$ layer of a low hole concentration on the light-emitting layer 5 side and a $p^+$ layer of a high hole concentration on the electrode 7 side.

The An $Al_XGa_YIn_{1-X-Y}N$ ($0 \leq X \leq 1$, $0 \leq Y \leq 1$, $X+Y \leq 1$) may be replaced for the light-emitting layer 5 instead of InGaN.

The respective semiconductor layers on the buffer layer 3 are formed by means of the known MOCVD method. In this growth method, an ammonia gas and gases of group III metal alkyl compounds such as trimethylgallium (TMG), trimethylaluminum (TMA) and trimethylindium (TMI) are supplied onto a substrate heated to an appropriate temperature and are subjected to a thermal decomposition reaction to thereby grow a desired crystal on the substrate.

After the p-type clad layer 6 is formed, the p-type clad layer 6, the light-emitting layer 5 and the n-type clad layer 4 are partially etched. Then, an n-type electrode 9 is formed on the n-type clad layer 4 by means of vapor deposition.

A light-transmissible electrode 7, which is constituted by a thin film containing gold, is laminated to cover the substantially whole area of an upper face of the p-type clad layer 6. A p-type electrode 8, which is constituted also by a material containing gold, is formed on the light-transmissible electrode 7 by means of vapor deposition. Further, if the light-transmissible electrode 7 is constituted by a thick film, a light-emitting device of the type of reflecting emitted light and taking-out light from the transparent sapphire substrate 2 may be provided.

Second Embodiment

Figure 2:
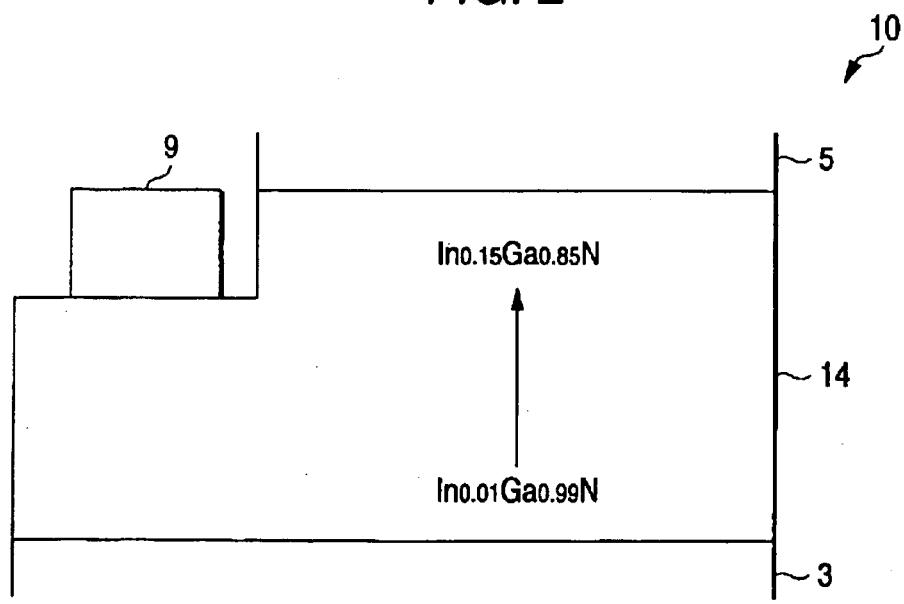
FIG. 2 is an enlarged sectional view of important part of a light-emitting diode 10 as another embodiment of the present invention.

FIG. 2 shows an enlarged view of important part of a light-emitting diode 10 as another embodiment of the present invention. Incidentally, the same members as used in the light-emitting diode 1 in the first embodiment are referred to by the same characters and the description thereof will be omitted.

In the light-emitting diode 10, the composition of an n-type clad layer 14 is changed continuously from $n\text{-}In_{0.01}Ga_{0.99}N$ (doped with Si) to $n\text{-}In_{0.15}Ga_{0.85}N$ (doped with Si) in the direction toward the light-emitting layer 5 from the buffer layer 3. In the light-emitting diode 10, the composition ratio of In of the n-type clad layer becomes small on the buffer layer 3 side. Hence, the difference between the lattice constant of the n-type clad layer and the lattice constant of the buffer layer 3 is reduced, so that the crystallinity of the n-type clad layer 14 is improved. Further, the composition ratio of In of the n-type clad layer 14 becomes substantially equal to that in the light-emitting layer 5, on the light-emitting layer 5 side. Hence, the lattice constant of the n-type clad layer 14 becomes substantially equal to that of the light-emitting layer 5. Accordingly, the crystallinity of the light-emitting layer 5 is also improved.

When the MOCVD method is used for the formation of the n-type clad layer 14, the composition ratio of raw-material gases is changed continuously. In this manner, the n-type clad layer 14 having the composition changed continuously in the direction toward the light-emitting layer 5 side from the buffer layer 3 side is obtained.

Third Embodiment

Figure 3:
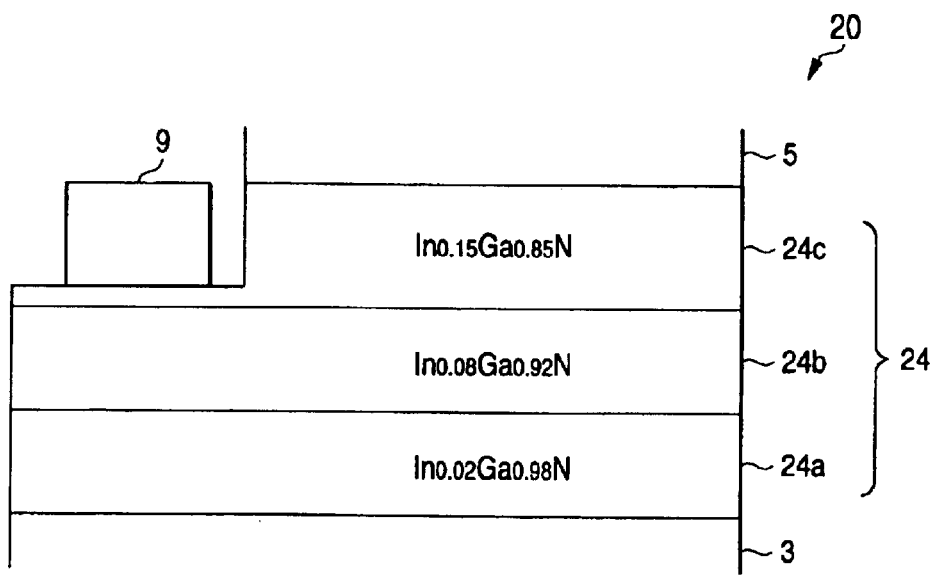
FIG. 3 is an enlarged view of important part of a light-emitting diode 20 as a further embodiment of the present invention.

FIG. 3 shows an enlarged view of important part of a light-emitting diode 20 as a further embodiment of the present invention. Incidentally, the same members as used in the light-emitting diode 1 in the first embodiment are referred to by the same characters and the description thereof will be omitted.

In the-light-emitting diode 20, the composition of an n-type clad layer 24 is changed to three stages of n-$In_{0.02}Ga_{0.98}N$ (doped with Si), n-$In_{0.08}Ga_{0.92}N$ (doped with Si) and n-$In_{0.15}Ga_{0.85}N$ (doped with Si) in the direction toward the light-emitting layer 5 from the buffer layer 3. In the light-emitting diode 20, the composition ratio of In of the n-type clad layer 24 becomes small on the buffer layer 3 side. Hence, the difference between the lattice constant of the n-type clad layer 24 and the lattice constant of the buffer layer 3 is reduced, so that the crystallinity of the n-type clad layer 24 is improved. Further, the composition ratio of In of the n-type clad layer 24 becomes substantially equal to that in the light-emitting layer 5, on the light-emitting layer 5 side. Hence, the lattice constant of the n-type clad layer 24 becomes substantially equal to that of the light-emitting layer 5. Accordingly, the crystallinity of the light-emitting layer 5 is also improved.

When the MOCVD method is used for the formation of the n-type clad layer 24, the composition ratio of raw-material gases is changed stepwise. In this manner, the n-type clad layer 24 having the composition changed stepwise in the direction toward the light-emitting layer 5 side from the buffer layer 3 side is obtained.

Although this embodiment has shown the case where the composition of the n-type clad layer 24 is changed to three stages, the present invention is not limited to the three-stage change.

Embodiments according to the second aspect of the present invention will be described below with reference to the drawings.

Fourth Embodiment

Figure 4:
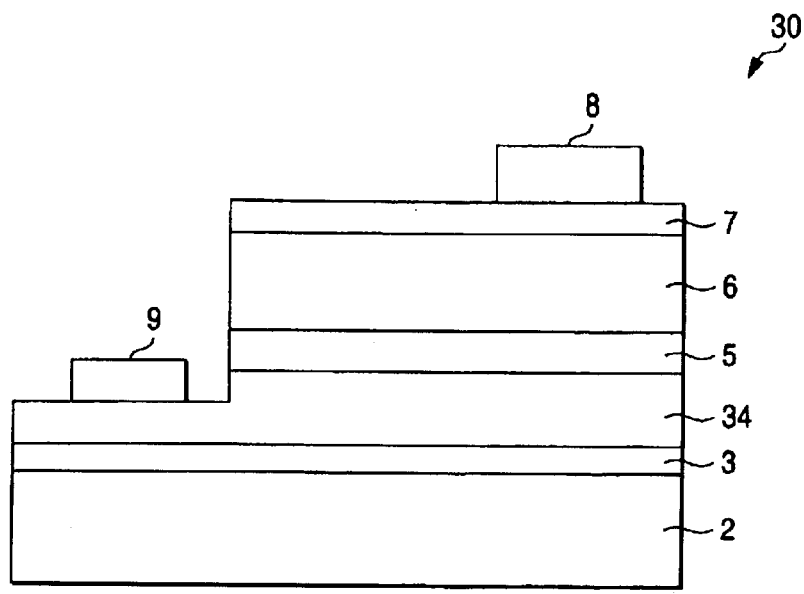
FIG. 4 is a sectional view showing a light-emitting diode 30 as a further embodiment of the present invention.

FIG. 4 shows a light-emitting diode 30 as an embodiment of the present invention. Incidentally, the same members as used in the light-emitting diode 1 in the first embodiment are referred to by the same characters and the description thereof will be omitted.

In the light-emitting diode 30, an n-type clad layer 34 is formed of n-$Al_{0.11}Ga_{0.61}In_{0.28}N$ (doped with Si). The thickness of the n-type clad layer 34 is 4 $\mu$m. Addition of Al to the composition makes it possible to widen the band gap of the n-type clad layer 34. Hence, the n-type clad layer 34 has the role of a barrier layer to holes overflowed from the light-emitting layer 5.

Fifth Embodiment

Figure 5:
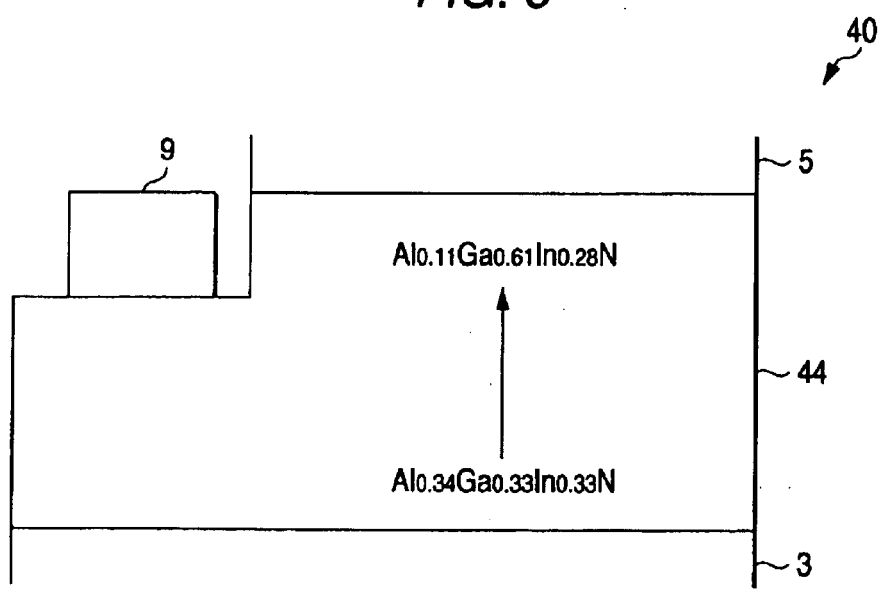
FIG. 5 is an enlarged view of important part of a light-emitting diode 40 as a further embodiment of the present invention.

FIG. 5 shows an enlarged view of important part of a light-emitting diode 40 as another embodiment of the present invention. Incidentally, the same members as used in the light-emitting diode 1 in the first embodiment are referred to by the same characters and the description thereof will be omitted.

In the light-emitting diode 40, the composition of an n-type clad layer 44 is changed continuously from n-$Al_{0.34}Ga_{0.33}In_{0.33}N$ (doped with Si) to n-$Al_{0.11}Ga_{0.61}In_{0.28}N$ (doped with Si) in the direction toward the light-emitting layer 5 from the buffer layer 3. By the change of the composition in the aforementioned manner, the n-type clad layer 44 lattice-matched with the buffer layer 3 in a face touching the buffer layer 3 and lattice-matched with the light-emitting layer 5 in a face touching the light-emitting layer 5 is obtained. As a result, the n-type clad layer 44 and the light-emitting layer 5 are formed on lattice-matched undercoats respectively, so that the crystallinity of the light-emitting layer 5 is improved synergistically.

Further, in the face touching the light-emitting layer 5, the band gap of the n-type clad layer 44 is wider than the band gap of the light-emitting layer 5, so that the n-type clad layer 44 has the role of a barrier layer to holes generated in the light-emitting layer 5.

When the MOCVD method is used for the formation of the n-type clad layer 44, the composition ratio of raw-material gases is changed continuously. In this manner, the n-type clad layer 44 having the composition changed continuously in the direction toward the light-emitting layer 5 side from the buffer layer 3 side is obtained.

Sixth Embodiment

Figure 6:
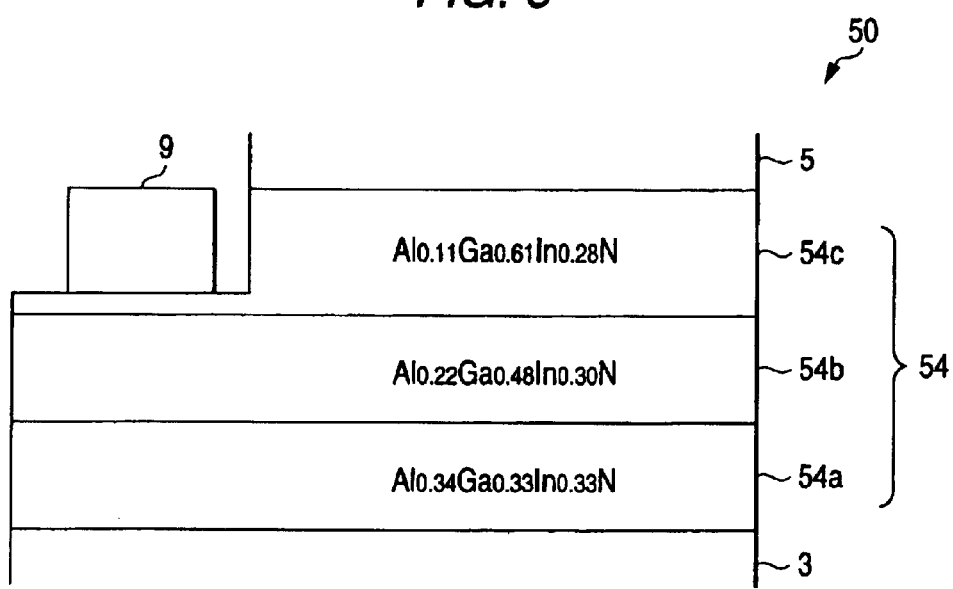
FIG. 6 is an enlarged view of important part of a light-emitting diode 50 as a further embodiment of the present invention.

FIG. 6 shows an enlarged view of important part of a light-emitting diode 50 as a further embodiment of the present invention. Incidentally, the same members as used in the light-emitting diode 1 in the first embodiment are referred to by the same characters and the description thereof will be omitted.

In the light-emitting diode 50, the composition of an n-type clad layer 54 is changed to three stages of n-$Al_{0.34}Ga_{0.33}In_{0.33}N$ (doped with Si), n-$Al_{0.22}Ga_{0.48}In_{0.30}N$ (doped with Si) and n-$Al_{0.11}Ga_{0.61}In_{0.28}N$ (doped with Si) in the direction toward the light-emitting layer 5 side from the buffer layer 3 side. By the change of the composition in the aforementioned manner, the n-type clad layer 54 lattice-matched with the buffer layer 3 in a face touching the buffer layer 3 and lattice-matched with the light-emitting layer 5 in a face touching the light-emitting layer 5 is obtained. As a result, the n-type clad layer 54 and the light-emitting layer 5 are formed on lattice-matched undercoats respectively, so that the crystallinity of the light-emitting layer 5 is improved synergistically.

Further, in the face touching the light-emitting layer 5, the band gap of the n-type clad layer 54 is wider than the band gap of the light-emitting layer 5, so that the n-type clad layer 54 has the role of a barrier layer to holes overflowed from the light-emitting layer 5.

When the MOCVD method is used for the formation of the n-type clad layer 54, the composition ratio of raw-material gases is changed stepwise. In this manner, the n-type clad layer 54 having the composition changed stepwise in the direction toward the light-emitting layer 5 side from the buffer layer 3 side is obtained.

Although this embodiment has shown the case where the n-type clad layer is changed to three stages, the present invention is not limited to the three-stage change.

This invention is not limited to the above description of the mode for carrying out the invention and embodiments thereof at all, and includes various modifications that can be conceived by those skilled in the art without departing from the scope of the claims.

The following facts will be disclosed below.

A group III nitride compound semiconductor device of a successively laminated structure comprising:
  a substrate;
  a buffer layer;
  a first layer formed of doped $In_XGa_{1-X}N$ (0<X<1); and
  a second layer formed of non-doped $In_YGa_{1-Y}N$ (0<Y<1).

In the above semiconductor device, the composition ratio of In in the first layer is changed continuously or intermittently in the direction toward the second layer side from the buffer layer side so that the composition of the first layer in a face touching the second layer becomes substantially equal to the composition of the second layer.

What is claimed is:

1. A group III nitride compound semiconductor device of a successively laminated structure, comprising:
  a substrate;
  a buffer layer formed directly on said substrate and having a buffer layer lattice constant;
  an intervening layer formed directly on said buffer layer, said intervening layer comprising $Al_aGa_bIn_{1-a-b}N$, where 0<a<1, 0<b<1, and a+b<1;
  a light-emitting layer formed directly on said intervening layer, said light-emitting layer comprising $In_YGa_{1-Y}N$, where 0<Y<1, and having a light-emitting layer lattice constant; and
  a p-type clad layer formed directly on said light-emitting layer,
    wherein said p-type clad layer comprises an ungraded GaN layer, and
    wherein composition ratios of at least Al and In of said intervening layer change from a first interface with said buffer layer to a second interface with said light-emitting layer, such that, a first lattice constant of said intervening layer at said first interface is lattice-matched to said buffer layer and changes to a second lattice constant at said second interface, which is substantially equal to said light-emitting layer lattice constant.

2. A group III nitride compound semiconductor device according to claim 1, wherein said composition ratios of at least Al and In of said intervening layer change continuously in a direction toward said light-emitting layer from said first interface with said buffer layer, so that, a band gap at said second interface of said intervening layer is wider than a band gap of said light-emitting layer.

3. A group II nitride compound semiconductor device according to claim 1, wherein said buffer layer comprises $Al_XGa_{1-X}N$ (0≦X≦1).

4. A group II nitride compound semiconductor device according to claim 1, wherein said composition ratios of said at least Al and In of said intervening layer change from 0.34 for Al and 0.33 for In at said first interface with said buffer layer to 0.11 for Al and 0.28 for In at said second interface with said light-emitting layer.

5. A group III nitride compound semiconductor device according to claim 1, wherein said composition ratios of at least Al and In of said intervening layer change discontinuously in a direction toward said light-emitting layer from said first interface with said buffer layer, so that, a band gap at said second interface of said intervening layer is wider than a band gap of said light-emitting layer.

* * * * *